(12) United States Patent
Hoekstra (10) Patent No.: US 11,822,035 B2
(45) Date of Patent: Nov. 21, 2023

(54) PASSIVE INDUCTIVE PROXIMITY SENSOR ARRAY SIGNAL PROCESSING CIRCUIT

(71) Applicant: GE Aviation Systems LLC, Grand Rapids, MI (US)

(72) Inventor: Eric J. Hoekstra, Holland, MI (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 17/382,524

(22) Filed: Jul. 22, 2021

(65) Prior Publication Data
US 2023/0023162 A1    Jan. 26, 2023

(51) Int. Cl.
*G01V 3/10* (2006.01)
*H03K 5/24* (2006.01)
*B64D 47/00* (2006.01)

(52) U.S. Cl.
CPC .............. *G01V 3/10* (2013.01); *B64D 47/00* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 5,498,958 A * | 3/1996 | Tu | H03K 17/9525 324/207.16 |
| 6,236,200 B1 | 5/2001 | Nekado et al. | |
| 7,808,235 B2 | 10/2010 | Rollins et al. | |
| 9,026,273 B2 | 5/2015 | Ziarno | |
| 9,026,336 B2 | 5/2015 | Ziarno | |
| 9,576,404 B2 | 2/2017 | Ziarno et al. | |
| 9,803,999 B2 | 10/2017 | Stothers et al. | |
| 9,914,547 B2 | 3/2018 | Zaccaria et al. | |
| 10,469,920 B2 | 11/2019 | Zacchio et al. | |
| 2002/0149376 A1 * | 10/2002 | Haffner | G01V 3/101 324/635 |

(Continued)

FOREIGN PATENT DOCUMENTS

| | | |
|---|---|---|
| CN | 104654992 A | 5/2015 |
| CN | 112311375 A | 2/2021 |

(Continued)

OTHER PUBLICATIONS

Kreit Darran et al. ; Pressure Sensitive Inductive Detector for Use in User Interfaces; EP 2005281 B1; Date Published Aug. 12, 2009; IPC:G06F3/033 (Year: 2009).*

(Continued)

*Primary Examiner* — Nasima Monsur
(74) *Attorney, Agent, or Firm* — Dinsmore & Shohl LLP (57) ABSTRACT

A proximity sensor comprises a reference inductor, a first set of sensor inductors, a first set of comparators, each comparator of the first set of comparators corresponding to one of the sensor inductors of the first set of sensor inductors, and an alternating current voltage source to output a sinusoidal voltage to the reference inductor and each of the sensor inductors. Each comparator of the first set of comparators receives a voltage across the reference inductor as a reference voltage and each comparator of the first set of comparators receives a voltage across a corresponding sensor inductor as an input voltage.

15 Claims, 3 Drawing Sheets

(56) References Cited

U.S. PATENT DOCUMENTS

| | | | | |
|---|---|---|---|---|
| 2009/0140727 A1* | 6/2009 | Rollins | .................... | G01B 7/14 |
| | | | | 324/207.16 |
| 2011/0057668 A1* | 3/2011 | Chen | ..................... | G01B 7/023 |
| | | | | 324/655 |
| 2018/0113005 A1* | 4/2018 | Selvaraj | ............. | H03K 17/9502 |

FOREIGN PATENT DOCUMENTS

| | | |
|---|---|---|
| DE | 102007046707 A1 | 4/2009 |
| DE | 102017003657 A1 | 10/2018 |
| EP | 0316914 A2 | 5/1989 |
| EP | 1825594 B1 | 3/2009 |
| EP | 2005281 B1 | 8/2009 |
| JP | 2003215108 A | 7/2003 |

OTHER PUBLICATIONS

Ichiyama Yoshikazu; Inductance Difference Detecting Circuit, and Magnetic Flaw Detector and Metal Piece Detection Device Using the Inductance Difference Detecting Circuit; JP 2003215108 A; Date Published Jul. 30, 2003 (Year: 2003).*

Partial European Search Report for Application No. 22179989.3 dated Dec. 13, 2022 (15 pages).

Extended European Search Report for Application No. 22179989.3 dated Apr. 5, 2023 (15 pages).

\* cited by examiner

PASSIVE INDUCTIVE PROXIMITY SENSOR ARRAY SIGNAL PROCESSING CIRCUIT

FIELD

The present disclosure relates to proximity sensors, and more specifically, to a passive inductive proximity sensor array signal processing circuit.

BACKGROUND

Aircraft and other vehicles or equipment may utilize proximity sensors to detect states of the aircraft or other systems. For example, an aircraft may use proximity sensors to detect the state of various systems and equipment on the aircraft. A proximity sensor may detect the presence of a metal (e.g., a ferrous metal) in close proximity to the sensor. Thus, a proximity sensor may be used to determine that various systems or equipment are functioning properly by verifying the mechanical position of moving parts (e.g., landing gear, flaps, etc.).

When proximity sensors are used in aircraft or other critical systems, high reliability of the sensors may be required to meet government, industry, or other safety standards. In addition, proximity sensors may need to operate in adverse conditions such as extreme temperatures or pressures that may occur during operation of an aircraft. Thus, proximity sensors used in aircraft systems may be required to operate with high reliability over a wide temperature range.

A simple inductive coil may be used as a proximity sensor that may be used in an aircraft. When a metal is brought near the inductor coil, the inductance of the coil changes; if the metal is ferrous, it increases. Thus, monitoring the inductance of the coil allows the proximity sensor to detect the presence of nearby metals. The use of a simple inductor coil may increase the temperature operating range of the sensor and the lifetime of the sensor before failure, as there are a minimum number of components involved. However, in aircraft and other applications, it may be necessary to detect minute changes in the inductance of the coil to detect the presence of a nearby metal. Detection of such minute changes in inductance may be complicated and may involve complicated electronics, which are more prone to failure. Accordingly, there is a need for a simplified circuit to detect changes in inductance of an inductor coil as part of a proximity sensor.

DETAILED DESCRIPTION

The present disclosure generally relates to proximity sensors. A proximity sensor may detect when a metal (e.g., a ferrous metal) is in close proximity to the sensor. This may be useful in a variety of applications. In one example, proximity sensors may be utilized in aircraft systems to determine that the aircraft systems are operating properly. However, it should be understood that in other examples, the disclosed proximity sensors may be used in other applications.

In aircraft, proximity sensors may be used to determine if various aircraft systems (e.g., landing gear, flaps, and the like) are operating properly. As such, it is important that proximity sensors have high reliability. In addition, aircraft are often subject to harsh environmental conditions (e.g., a wide range of temperatures). Accordingly, it is important that proximity sensors used in aircraft are able to operate in such conditions. For all of these reasons, a proximity sensor may advantageously be simplified to comprise an induction coil. When a target metal is in close proximity to the induction coil, the inductance of the coil will change. Accordingly, detecting a change of inductance in the coil will allow the proximity sensor to detect the presence of a metal in proximity to the coil.

The use of an induction coil as the sensor mechanism may have many benefits due to its simplicity. An induction coil can be ruggedized to a degree such that it may operate for over one million hours before failure. Furthermore, an induction coil may be rated for use over a wide range of temperatures (e.g., from −65° C. to 150° C.). As such, an induction coil may be desirable for use as a sensor mechanism in a proximity sensor of an aircraft.

However, detecting a change in the inductance of the coil may be complicated. In particular, the change in inductance of the coil when a metal is in proximity to an induction coil may be quite small. For example, when a metal is brought near an inductor coil, the change in inductance may be less than 2%. As such, previous implementations using simple inductive proximity sensors have relied on complex drive and detection mechanisms with associated installation and calibration procedures to detect such minute changes in the inductance of an inductor coil in a proximity sensor. For example, a detection mechanism may try to clone laboratory instruments and use computers to detect a change in inductance. However, the complicated nature of such a detection mechanism may negate the benefits of using a simple induction coil as the sensor mechanism.

Accordingly, disclosed herein is a simplified circuit to interface with an inductive coil used as a proximity sensor. The proximity sensor disclosed herein utilizes an inductor coil as the sensor mechanism to detect the proximity of a target metal. The proximity sensor disclosed herein further comprises a simplified circuit to detect a change of inductance in the inductor coil. Furthermore, the proximity sensor disclosed herein utilizes a detection circuit that is able to detect a change in inductance of multiple induction coils (e.g., multiple sensors located at various locations in an aircraft). In addition, the proximity sensor disclosed herein utilizes a redundant detection mechanism with built-in test features to increase reliability of the sensor and detect any sensor or wiring failures.

Figure 1:
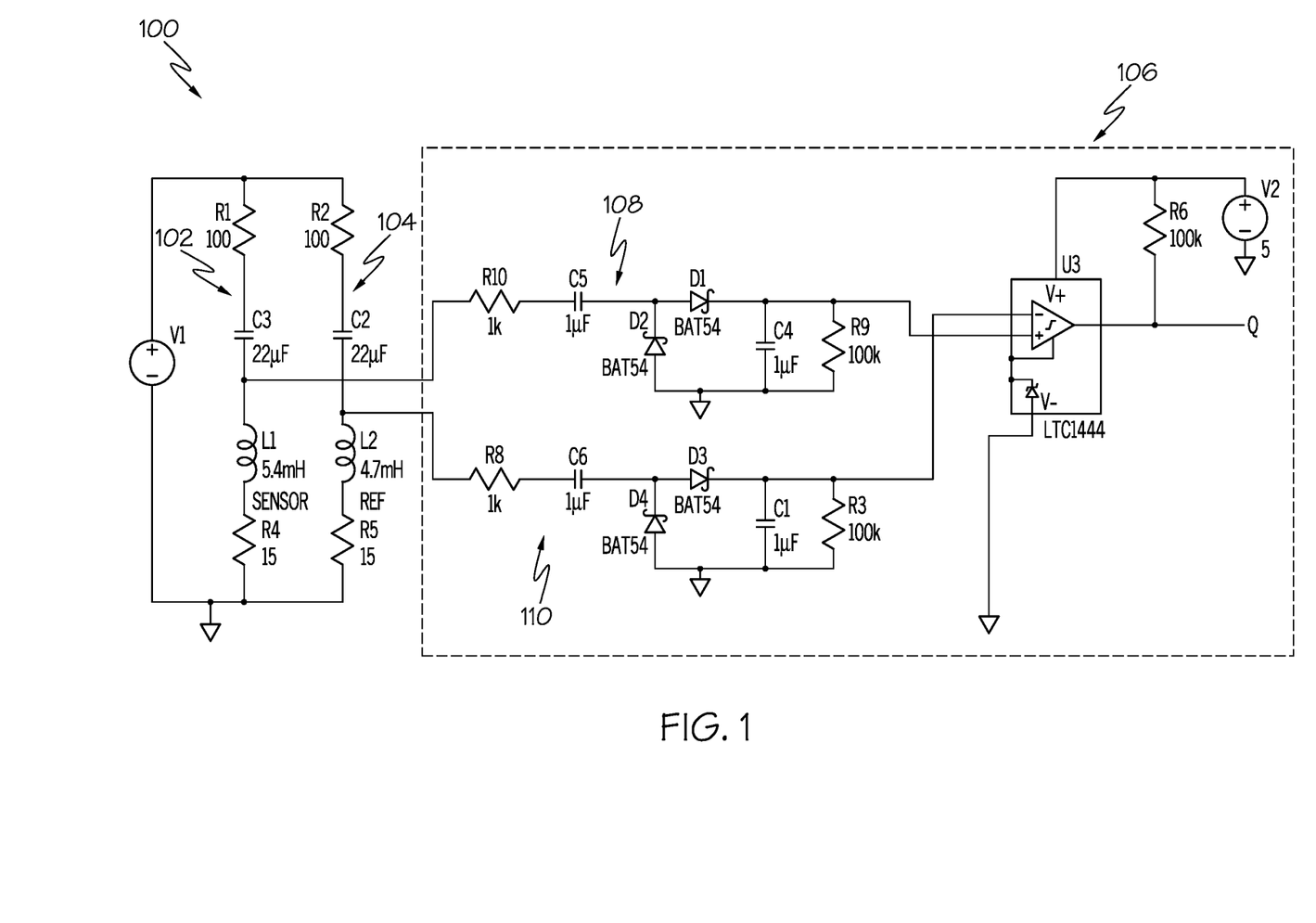
FIG. 1 schematically depicts an example proximity sensor circuit, according to one or more embodiments shown and described herein.

Turning now to FIG. 1, an example proximity sensor circuit 100 is shown utilizing a single sensor. In the example of FIG. 1, the sensor comprises an inductor L1. The inductor L1 may be packaged in a hermetically sealed stainless steel case and may be placed in an aircraft system to detect the proximity of metals to the inductor L1 and thereby determine whether the aircraft system is functioning properly. When a target metal is in close proximity to the inductor L1, the inductance of the inductor L1 changes. Accordingly, detecting a change in the inductance of the inductor L1 allows the proximity sensor circuit 100 to detect the presence of a target metal in proximity to the inductor L1, as disclosed herein.

Because the inductor L1 is passive, it must be driven by an external source to determine its properties and whether those properties have been affected by the presence of a proximate metal. However, because the inductor L1 is housed in a stainless steel or other conductive case, high frequency eddy current based techniques commonly used in inductive proximity sensors cannot be used. As such, as disclosed herein, a reference inductor with a known inductance is used to indirectly determine the inductance of the sensor inductor L1. In the proximity sensor circuit 100, both the sensor inductor L1 and a reference inductor L2 are driven by the same excitation voltage V1, as disclosed herein. However, the reference inductor L2 is positioned at a location separate from the location of the sensor inductor L1.

By using a reference inductor L2 that is part of the same proximity sensor circuit 100 as the sensor inductor L1, any variations in the excitation voltage V1 will affect both of the inductors L1 and L2 in a similar manner. Accordingly, any variations in frequency or amplitude is largely nulled out. Thus, the excitation voltage V1 does not need to output a perfectly stable sinusoidal voltage signal for the proximity sensor circuit 100 to operate properly. In addition, the proximity sensor circuit 100 may continue to function properly in the presence of a temporary power surge or other irregularities, which affects both the sensor inductor L1 and the reference inductor L2 in the same manner, thereby increasing the reliability of the proximity sensor circuit 100 when operating in adverse environmental conditions.

When a target metal is brought near the sensor inductor L1, the inductance of the inductor L1 increases from a lower value (when the sensor is in an open state) to a higher value (when the sensor is in a closed state). However, because the reference inductor L2 is positioned physically distant from the sensor inductor L1, the inductance of the reference inductor L2 is not affected by the target metal. Furthermore, the reference inductor L2 may have a fixed inductance with an intermediate value in between the lower inductance of the inductor L1 in the open state and the higher inductance of the inductor L1 in the closed state. Thus, when a metal is not near the sensor inductor L1, the inductance of the sensor inductor L1 is lower than the inductance of the reference inductor L2 and when a metal is near the sensor inductor L1, the inductance of the sensor inductor L1 is higher than the inductance of the reference inductor L2. In the example of FIG. 1, the reference inductor L2 has an inductance of 4.7 mH and the sensor inductor L1 has an inductance of 4.4 mH when a metal is not near and may have an inductance greater than 4.7 mH (e.g., 5.4 mH) when a metal is near. However, in other examples, the inductors L1 and L2 may have other values.

Referring still to FIG. 1, the excitation voltage V1 outputs a sinusoidally oscillating voltage with a constant amplitude and frequency. The inductors L1 and L2 are in parallel and are both driven by the excitation voltage V1. In the illustrated example, the voltage V1 has a frequency of 2.5 kHz. However, in other examples, the voltage V1 may have a different frequency.

A capacitor C2 is connected to the reference inductor L2, thereby creating a circuit 104, and a capacitor C3 is connected to the sensor inductor L1, thereby creating another circuit 102. The circuits 102 and 104 are in parallel with each other. As such, as the sinusoidal excitation voltage V1 causes the voltages across the inductors L1 and L2 to oscillate, thereby generating magnetic fields around the inductors L1 and L2. Accordingly, when a target metal is brought near the sensor inductor L1, the voltage drop across the sensor inductor L1 increases with respect to the voltage drop across the reference inductor L2. This relative difference in voltage across the inductors L1 and L2 may be detected by the proximity sensor circuit 100, as disclosed herein. In some examples, the proximity sensor circuit 100 may operate in a non-resonant mode. As such, the frequency of the voltage V1 is not critical. In the illustrated example, the circuit 102 is a non-resonant circuit. However, in other examples, the proximity sensor circuit 100 could be made a resonant circuit, which may add greater detection sensitivity at a cost of greater sensitivity to oscillator frequency and component tolerance. In one example, the proximity sensor circuit 100 may be made a resonant circuit by making the capacitors C2 and C3 have capacitance values of 0.47 µF and connecting a bridge detector circuit 106 to a node between the resistor R1 and the capacitor C3 and to a node between the resistor R2 and a capacitor C2.

In the illustrated example, the capacitors C2 and C3 have a capacitance of 22 µF. However, in other examples, the capacitors may have different capacitance values. Current limiting resistors R1 and R4 are part of the circuit 102 of the sensor inductor L1 and current limiting resistors R2 and R5 are part of the circuit 104 of the reference inductor L2. In the example of FIG. 1, resistors R1 and R2 have a value of 100 Ohms and resistors R4 and R5 have a value of 15 Ohms. However, in other examples, the resistors R1, R2, R4, and R5 may have other values.

In order to measure the difference in voltages across the sensor inductor L1 and the reference inductor L2, a multi-channel bridge detector circuit 106 is used. The bridge detector circuit 106 compensates for and nulls out all major circuit non-idealities and provides a robust sensor read system with good rejection of the effects of temperature, circuit component tolerances, and wire harness effects.

As shown in FIG. 1, a first channel 108 of the bridge detector circuit 106 is connected to the circuit 102 containing the sensor inductor L1 and a second channel 110 of the bridge detector circuit 106 is connected to the circuit 104 containing the reference inductor L2. Accordingly, the first channel 108 of the bridge detector circuit 106 measures the voltage across the sensor inductor L1 and the second channel 110 of the bridge detector circuit 106 measures the voltage across the reference inductor L2. The first and second channels 108, 110 are input into a comparator U3. As shown in FIG. 1, the comparator U3 is powered by a voltage V2 (e.g., 5V) and has an output signal Q.

In the example of FIG. 1, the second channel 110, which measures the voltage across the reference inductor L2 is input to the comparator U3 as the reference voltage and the first channel 108, which measures the voltage across the sensor inductor L1, is input to the comparator U3 as the input voltage. As discussed, if there is no target metal in proximity to the sensor inductor L1, the inductance of the sensor L1 will be lower than the inductance of the reference sensor L2 and the voltage drop across the sensor inductor L1 will be less than the voltage drop across the reference inductor L2. Thus, the input voltage of the comparator U3 will be less than the reference voltage of the comparator U3 and the comparator will output a low signal (e.g., 0V). Alternatively, if a target metal is in proximity to the sensor inductor L1, the inductance of the sensor L1 will be higher than the inductance of the reference sensor L2 and the voltage drop across the sensor inductor L1 will be greater than the voltage drop across the reference inductor L2. Thus, the input voltage of the comparator U3 will be greater than the reference voltage of the comparator U3 and the comparator will output a high signal (e.g., 5V). As such, the output of the comparator U3 indicates whether there is a metal in proximity to the sensor inductor L1. In some examples, the comparator U3, other disclosed comparators, or other disclosed components may output a low signal to indicate a positive result, rather than a high signal.

The bridge detector circuit 106 may increase measurement sensitivity and reduce effects of instabilities in the excitation voltage V1. As shown in FIG. 1, the first channel 108 of the bridge detector circuit 106 includes resistors R9 and R10, capacitors C4 and C5, and diodes D1 and D2 (e.g., Schottky diodes). In the example of FIG. 1, the resistor R9 has a resistance of 100 kOhms, the resistor R10 has a resistance of 1 kOhm, and the capacitors C4 and C5 have a capacitance of 1 µF. However, in other examples, the resistors R9 and R10 and the capacitors C4 and C5 may have other values. In the example of FIG. 1, the diodes D1 and D2 are BAT54 Schottky diodes. However, in other examples, other diodes may be used as the diodes D1 and D2. The second channel 110 of the bridge detector circuit 106 includes resistors R3 and R8, capacitors C1 and C6, and diodes D3 and D4 having similar values and arranged in a similar manner as the first channel 108.

Figure 2:
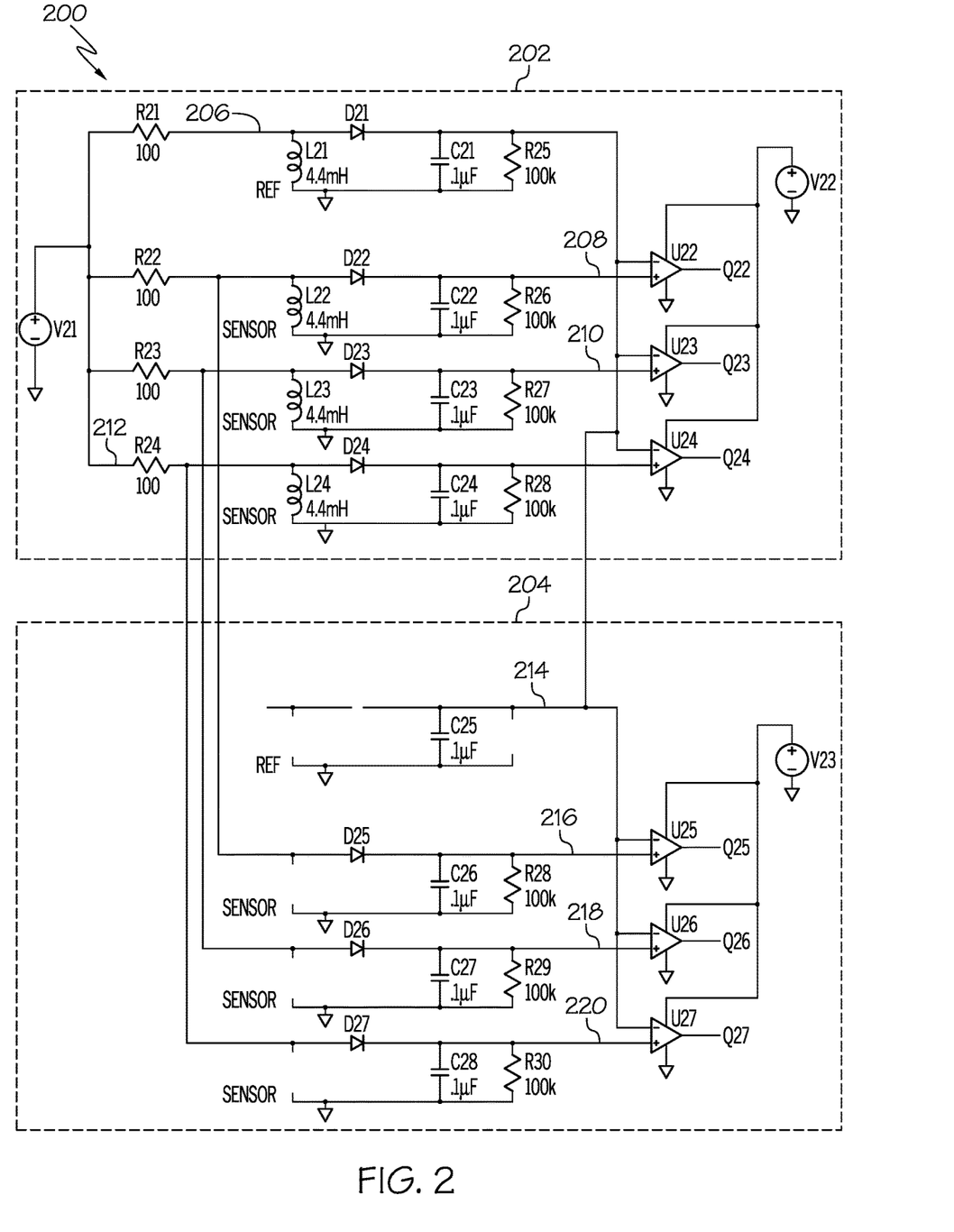
FIG. 2 schematically depicts another example proximity sensor circuit, according to one or more embodiments shown and described herein.

As disclosed herein, the proximity sensor circuit 100 may detect whether a target metal is in proximity to the sensor inductor L1. Specifically, when the output Q of the comparator U3 is high, a target metal is near the sensor inductor L1 and when the output Q of the comparator U3 is low, a target metal is not near the sensor inductor L1. However, the proximity sensor circuit 100 may only detect the proximity of metal to a single sensor. FIG. 2, discussed below, illustrates a circuit that may detect the proximity of metal to multiple sensors with redundancy.

Turning now to FIG. 2, an example proximity sensor circuit 200 is shown that utilizes multiple sensors. The proximity sensor circuit 200 of FIG. 2 includes a master circuit 202 and a monitor or slave circuit 204. The monitor circuit 204 provides redundancy of the detection performed by the master circuit 202 as disclosed in further detail below.

In the example of FIG. 2, the master circuit 202 includes a reference inductor L21 and a plurality of sensor inductor L22, L23, and L24. The sensor inductors L22, L23, and L24 may be placed at a variety of locations on an aircraft to monitor various aircraft systems. As such, the sensor inductors L22, L23, and L24 represent a sensor array. When a target metal comes into proximity with any of the sensor inductors L22, L23, or L24, the inductance of that sensor increases, which may be detected as disclosed herein. While the proximity sensor circuit 200 of FIG. 2 includes three sensor inductors, it should be understood that in other examples, the proximity sensor circuit 200 may include any number of sensor inductors.

The reference inductor L21 of the master circuit 202 has a fixed inductance which may be compared to the inductance of each of the sensor inductors L22, L23, and L24, as disclosed herein. In particular, the inductance of the reference inductor L21 may be greater than the inductance of each of the sensor inductors L22, L23, and L24 when there is no metal in proximity to any of the sensor inductors and less than the inductance of the sensor inductors L22, L23, and L24 in proximity to a target metal. In the example of FIG. 2, the reference inductor L21 has an inductance of 4.7 mH, whereas the sensor inductors L22, L23, and L24 each have an inductance of 4.4 mH, which may increase to an inductance greater than 4.7 mH (e.g., 5.4 mH) in the presence of a target metal. However, in other examples, the reference inductor L21 and the sensor inductors L22, L23, and L24 may have other values.

In the example of FIG. 2, the master circuit 202 includes a channel 206 through which electrical current flows through the reference inductor L21 and channels 208, 210, and 212 through which current flows through each of the sensor inductors L22, L23, and L24. Each of the channels 206, 208, 210, and 212 are constructed similarly. The channel 206 includes current limiting resistors R21 and R25, a diode D21, the reference inductor L21 and a capacitor C21. The reference inductor L21 and the capacitor C21 form a circuit branch that may be driven with a sinusoidal excitation voltage. In the example of FIG. 2, the resistor R21 has a resistance of 100 Ohms, the resistor R25 has a resistance of 100 kOhms, and the capacitor C21 has a capacitance of 0.1 µF. However, in other examples, the components may have other values. In the example of FIG. 2, the diode D21 is a 1N914 diode. However, in other examples, other diodes may be used. The channels 208, 210, and 212 are constructed in a similar manner as the channel 206 with the reference inductor L21 replaced with the sensor inductors L22, L23, and L24, respectively.

The channels 206, 208, 210, and 212 are in parallel with each other and an AC voltage source V21 supplies a sinusoidal excitation voltage to each of the channels 206, 208, 210, and 212. The AC voltage V21 causes the voltage across the inductors L21, L22, L23, and L24, thereby creating magnetic fields, which may be utilized to detect the presence of metals. Because the same voltage V21 excites the reference inductor L21 and each of the sensor inductors L22, L23, and L24, any fluctuations with the excitation voltage V21 will affect all of the inductors equally. Thus, measurements of the relative inductance between the reference inductor L21 and the sensor inductors L22, L23, and L24 will be unaffected by fluctuations in the excitation voltage V21. Accordingly, the AC voltage V21 need not be a perfect sinusoidal signal to precisely measure changes to the inductance of the sensor inductors L22, L23, and L24 caused by the proximity of metals.

Comparators U22, U23, and U24 are used to compare the voltage across the reference inductor L21 to the voltages across each of the sensor inductors L22, L23, and L24. In the example of FIG. 2, each of the comparators U22, U23, and U24 is an LTC6752 comparator. However, in other examples, other comparators may be used. A voltage V22 (e.g., 5V) supplies power to each of the comparators U22, U23, and U24. The comparators U22, U23, and U24 monitor the channels 206, 208, 210, and 212.

The voltage across the reference inductor L21 is input to each of the comparators U22, U23, and U24 as the reference voltage. Furthermore, the voltage across the sensor inductor L22 is used as the input voltage to the comparator U22, the voltage across the sensor inductor L23 is used as the input voltage to the comparator U23, and the voltage across the sensor inductor L24 is used as the input voltage to the comparator U24. As such, the comparator U22 compares the voltage of the reference inductor L21 to the voltage of the sensor inductor L22, the comparator U23 compares the voltage of the reference inductor L21 to the voltage of the sensor inductor L23, and the comparator U24 compares the voltage of the reference inductor L21 to the voltage of the sensor inductor L24. If the voltage across any of the sensor inductors L22, L23, or L24 is greater than the voltage across the reference inductor L21, than the respective comparator U22, U23, or U24 will output a high signal output Q22, Q23, or Q24 (e.g., 5V), indicating the presence of a metal near the corresponding sensor inductor. If the voltage across any of the sensor inductors L22, L23, or L24 is less than the voltage across the reference inductor L21, then the respective comparator U22, U23, or U24 will output a low signal output (e.g., 0V), indicating that a metal is not near the corresponding sensor inductor. Thus, the proximity sensor circuit 200 may simultaneously detect whether target metals are in proximity to each of a plurality of sensor inductors.

In the example of FIG. 2, in addition to the master circuit 202, the monitor circuit 204 may also compare the voltages across the reference inductor L21 to the voltages across the sensor inductors L22, L23, and L24, thereby providing a redundant detection mechanism. As such, if any of the components of the master circuit 202 fail or malfunction, the monitor circuit 204 may still accurately perform detection, as disclosed herein, thereby alerting a user to an error with the proximity sensor circuit 200 that may be further investigated.

As shown in FIG. 2, the monitor circuit 204 includes channels 214, 216, 218, and 220. In the example of FIG. 2, the channel 214 includes capacitor C25, which may be similar to the capacitor C21 of the master circuit 202. The channel 216 includes a diode D25, a capacitor C26, and a resistor R28, which may be similar to the diode D22, the capacitor C22, and the resistor R26 of the master circuit 202. The channels 218 and 220 may be constructed in a similar manner as the channel 216. The monitor circuit 204 also includes comparators U25, U26, and U27, which may be similar to the comparators U22, U23, and U24 of the master circuit 202, and may be powered by a voltage source V23.

As shown in FIG. 2, the same reference voltage that is input to the comparators U22, U23, and U24 may be input as the reference voltage to the comparators U25, U26, and U27. The voltage across the sensor inductors L22, L23, and L24 of the master circuit 202 may be input to the channels 216, 218, and 220, respectively, of the monitor circuit 204. Thus, the voltages across the sensor inductors L22, L23, and L24 may be input as the input voltages to the comparators U25, U26, and U27. Accordingly, when all of the components of the proximity sensor circuit 200 are functioning properly, the comparators U25, U26, and U27 of the monitor circuit 204 receive the same input voltages as the comparators U22, U23, and U24. Thus, the outputs Q25, Q26, and Q27 of the comparators U25, U26, and U27 will be the same as the outputs Q22, Q23, and Q24, respectively, of the comparators U22, U23, and U24 when all of the components of the proximity sensor circuit 200 are functioning properly. If the output Q22 of the comparator U22 is different from the output Q25 of the comparator U25, then a user may be alerted that there is a problem with the proximity sensor circuit 200. Similarly, if the output Q23 is different from the output Q26 or the output Q24 is different from the output Q27, a user may be alerted to a problem with the proximity sensor circuit 200. Thus, the monitor circuit 204 provides redundancy and increases the reliability of the proximity sensor circuit 200.

In some examples, the monitor circuit 204 may contain the same components as the master circuit 202 and may operate in a monitor mode rather than in a master mode, as disclosed herein. In particular, when operating in monitor mode, the voltage V21 is not applied and the inductors L21, L22, L23, and L24 are disabled, thereby resulting in the monitor circuit 204 as shown in FIG. 2. By utilizing the same circuit components for the master circuit 202 and the monitor circuit 204 (e.g., the same physical electronics box) but operating in a different mode, the proximity sensor circuit 200 may be further simplified.

In some examples, a pair of sensor inductors may be used to detect proximity of metal in certain systems to create an extra level of redundancy. For example, in the example of FIG. 2, the sensor inductor L22 and the sensor inductor L23 may both be placed in a landing gear system of an aircraft. Accordingly, when the proximity sensor circuit 200 is functioning properly, the output Q22 of the comparator U22 and the output Q23 of the comparator U23 should both output the same result indicating the proximity or lack of proximity of a target metal to the sensor inductors L22 and L23. If the outputs of the comparators U22 and U23 are different, a user may be alerted that there is a problem that may be further investigated. Using a pair of sensor inductors to detect proximity of a target metal to a single system or component may further increase the reliability of the proximity sensor circuit 200.

In the illustrated example, the master circuit 202 and the monitor circuit 204 are cable configured. That is, the position of an electronic box containing a circuit in a wiring hardness determines whether the circuit acts as the master circuit 202 or the monitor circuit 204. In some examples, the master circuit 202 and the monitor circuit 204 may be software configurable. That is, software may be used to select whether a circuit acts as the master circuit 202 or the monitor circuit 204.

Figure 3:
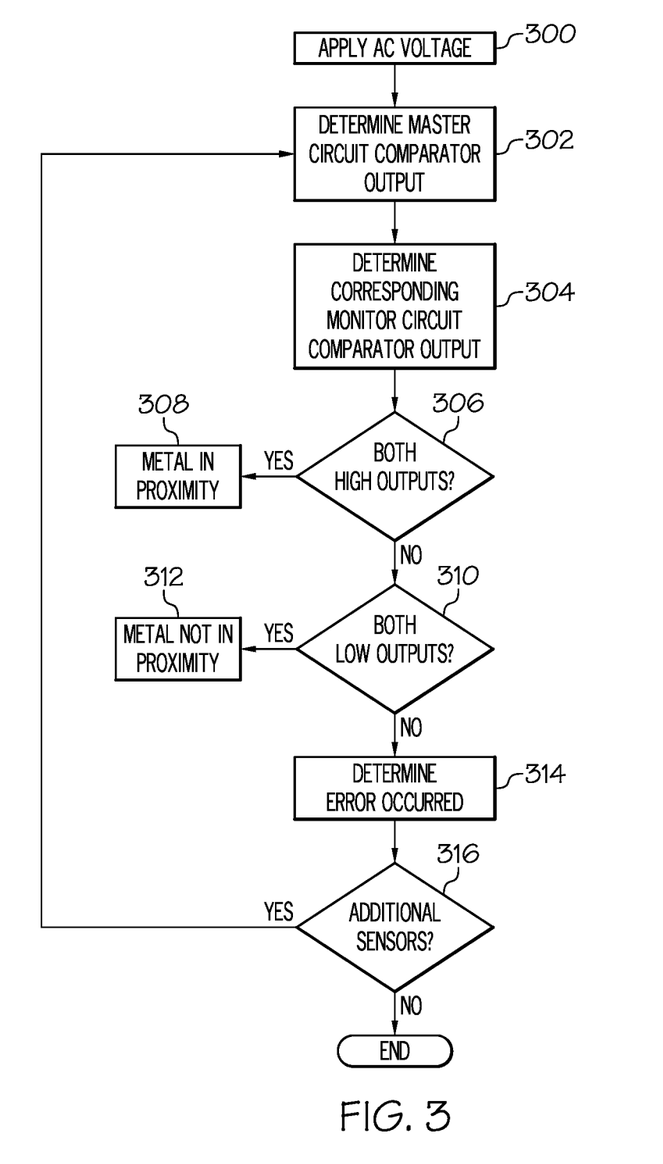
FIG. 3 shows a flowchart of a method for operating a proximity sensor circuit, according to one or more embodiments shown and described herein.

FIG. 3 depicts a flowchart of a method for operating the proximity sensor circuit 200 of FIG. 2 to determine whether a metal is in proximity to a plurality of sensor inductors. At step 300, the voltage source V21 applies an alternating current voltage to the reference inductor L21 and the sensor inductors L22, L23, and L24. At step 302, an output of one of the comparators of the master circuit 202 (e.g., comparator U22) is determined. In particular, it is determined whether the comparator of the master circuit 202 outputs a high signal or a low signal. At step 304, an output of the corresponding comparator in the monitor circuit 204 (e.g., comparator U25) is determined. In particular, it is determined whether the comparator of the monitor circuit 204 outputs a high signal or a low signal. The outputs of these two comparators may be used to evaluate a corresponding sensor inductor (e.g., sensor inductor L22).

At step 306, it is determined whether the comparator of the master circuit 202 and the corresponding comparator of the monitor circuit 204 both output a high signal. If both comparators output a high signal (yes at step 306), then it is determined that the voltage across the corresponding sensor inductor being evaluated is higher than the voltage across the reference inductor L21, as verified by both the master circuit 202 and the monitor circuit 204. Accordingly, at step 308, it is determined that a metal is in proximity to the sensor inductor. It can thus be determined whether a particular aircraft system is properly functioning based on whether a metal should be in proximity to the particular sensor inductor being evaluated.

If both comparators do not output a high signal (no at step 306), then at step 310, it is determined whether the comparator of the master circuit 202 and the corresponding comparator of the monitor circuit 204 both output a low signal. If both comparators output a low signal (yes at step 310), then it is determined that the voltage across the sensor inductor being evaluated is lower than the voltage across the reference inductor L21, as verified by both the master circuit 202 and the monitor circuit 204. Accordingly, at step 312, it is determined that a metal is not in proximity to the sensor inductor.

If both comparators do not output a low signal (no at step 310), then that means that one of the comparators outputs a high signal and the other comparator outputs a low signal. This indicates an error with the proximity sensor circuit 200 since both comparators should be reading the same voltages. Accordingly, at step 314 it is determined that an error occurred. The proximity sensor circuit 200 may then be evaluated to determine the source of the error or replaced.

At step 316, it is determined whether additional sensor inductors need to be evaluated (e.g., sensor inductors L23 and L24). If additional sensor inductors need to be evaluated (yes at step 316), then control returns to step 302 and another sensor inductor is evaluated. If no additional sensor inductors need to be evaluated (no at step 316), then the method of FIG. 3 ends.

It should now be understood that the devices, systems, and methods described herein provide a passive inductive proximity sensor array signal processing circuit. A proximity sensor circuit includes a master circuit and a monitor circuit. The master circuit includes a plurality of sensor inductors and a single reference inductor. Each sensor inductor may be placed in a different location in an aircraft. Capacitors may be placed in series with each of the sensor inductors and with the reference inductor to create circuit branches. A voltage source may output a sinusoidal oscillating voltage to drive each of the circuit branches.

The reference inductor and the sensor inductors may be connected to a bridge circuit comprising a plurality of comparators. Each comparator may receive the voltage across the reference inductor as a reference voltage and the voltage across one of the sensor inductors as the input voltage. The inductance of each of the sensor inductors may increase from a first inductance value to a higher second inductance value when a ferrous metal is in proximity to the sensor inductor. The inductance of the reference inductor may be in between the first inductance value and the second inductance value of the sensor inductors.

Each comparator may output a low signal when the voltage across the reference inductor is higher than the voltage across a corresponding sensor inductor and may output a high signal when the voltage across the reference inductor is lower than the voltage across the corresponding sensor inductor. Thus, each comparator outputs a high signal when a metal is in proximity to a corresponding sensor inductor.

The monitor circuit includes a separate plurality of comparators to provide redundancy to the measurements of the master circuit. Each comparator of the monitor circuit may receive the voltage across the reference inductor as the reference voltage and may receive the voltage across one of the sensor inductors as an input voltage. Thus, each comparator of the monitor circuit provides an independent output indicating whether a metal is near a corresponding sensor inductor.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

Further aspects of the disclosure are provided by the subject matter of the following clauses.

A proximity sensor comprising a reference inductor; a first set of sensor inductors; a first set of comparators, each comparator of the first set of comparators corresponding to one of the sensor inductors of the first set of sensor inductors; and an alternating current voltage source to output a sinusoidal voltage to the reference inductor and each of the sensor inductors, wherein each comparator of the first set of comparators receives a voltage across the reference inductor as a reference voltage; and wherein each comparator of the first set of comparators receives a voltage across a corresponding sensor inductor as an input voltage.

The proximity sensor of any preceding clause, wherein each sensor inductor of the first set of sensor inductors is placed in a system of an aircraft to determine a status of the system.

The proximity sensor of any preceding clause, wherein the reference inductor is placed in a location remote from each of the sensor inductors of the first set of sensor inductors.

The proximity sensor of any preceding clause, wherein each comparator of the first set of comparators is configured to output a high signal when the input voltage is higher than the reference voltage and each comparator of the first set of comparators is configured to output a low signal when the input voltage is lower than the reference voltage.

The proximity sensor of any preceding clause, wherein the proximity sensor determines that a metal is in proximity to the proximity sensor based on output signals from the first set of comparators.

The proximity sensor of any preceding clause, further comprising a first capacitor in series with the reference inductor to create a circuit branch; and a set of capacitors, wherein each capacitor in the set of capacitors is in series with an inductor of the first set of sensor inductors to create a circuit branch.

The proximity sensor of any preceding clause, wherein the reference inductor has a first inductance value; each comparator of the first set of comparators is configured to output a low signal when the corresponding sensor inductor of the first set of sensor inductors has a second inductance value lower than the first inductance value; and each comparator of the first set of comparators is configured to output a high signal when the corresponding sensor inductor of the first set of sensor inductors has a third inductance value greater than the first inductance value when a metal is in proximity to the corresponding sensor inductor.

The proximity sensor of any preceding clause, further comprising a second set of sensor inductors, wherein each sensor inductor of the second set of sensor inductors is positioned adjacent to one of the sensor inductors of the first set of sensor inductors to provide redundancy of detection.

The proximity sensor of any preceding clause, further comprising a second set of comparators, each comparator of the second set of comparators corresponding to one of the sensor inductors of the first set of sensor inductors; wherein each comparator of the second set of comparators receives a voltage across the reference inductor as a reference voltage; and wherein each comparator of the second set of comparators receives a voltage across a corresponding sensor inductor as an input voltage.

The proximity sensor of any preceding clause, wherein each comparator of the second set of comparators is configured to output a high signal when the input voltage is higher than the reference voltage and each comparator of the second set of comparators is configured to output a low signal when the input voltage is lower than the reference voltage, thereby providing redundancy of detection to the first set of comparators.

The proximity sensor of any preceding clause, wherein the proximity sensor determines that a metal is in proximity to the proximity sensor based on output signals from the first set of comparators and output signals from the second set of comparators.

A proximity sensor comprising a master circuit; and a monitor circuit positioned remotely from the master circuit, wherein the master circuit comprises a reference inductor and a plurality of sensor inductors, each of the sensor inductors is positioned remotely from the reference inductor; wherein the master circuit is configured to determine a change in inductance between each of the sensor inductors and the reference inductor when a metal is placed in proximity to the sensor inductors; and wherein the monitor circuit is configured to independently determine a change in inductance between each of the sensor inductors and the reference inductor when a metal is placed in proximity to the sensor inductors.

The proximity sensor of any preceding clause, further comprising an alternating current voltage source to output a sinusoidal voltage to the reference inductor and each of the sensor inductors.

The proximity sensor of any preceding clause, wherein the master circuit further comprises a plurality of comparators; and wherein each comparator receives a voltage across the reference inductor as a reference voltage and a voltage across one of the sensor inductors as an input voltage, such that each comparator outputs a low signal when the voltage across the reference inductor is greater than the voltage across one of the sensor inductors and outputs a high signal when the voltage across the reference inductor is lower than the voltage across one of the sensor inductors.

The proximity sensor of any preceding clause, wherein the monitor circuit further comprises a plurality of comparators; and wherein each comparator receives a voltage across the reference inductor as a reference voltage and a voltage across one of the sensor inductors as an input voltage, such that each comparator outputs a low signal when the voltage across the reference inductor is greater than the voltage across one of the sensor inductors and outputs a high signal when the voltage across the reference inductor is lower than the voltage across one of the sensor inductors.

The proximity sensor of any preceding clause, wherein the master circuit further comprises a first capacitor in series with the reference inductor to create a circuit branch; and a plurality of second capacitors, wherein each capacitor of the plurality of second capacitors is in series with one of the sensor inductors to create a plurality of circuit branches.

The proximity sensor of any preceding clause, wherein the reference inductor has a first inductance value; each sensor inductor has a second inductance value lower than the first inductance value when a metal is not in proximity to the sensor inductor; and each sensor inductor has a third inductance value greater than the first inductance value when a metal is in proximity to the sensor inductor.

A method comprising applying an alternating current voltage to a reference inductor and a plurality of sensor inductors of a master circuit; and determining whether a metal is in proximity to one or more of the sensor inductors based on first outputs of one or more comparators of the master circuit and second outputs of one or more comparators of a monitor circuit, wherein each comparator of the master circuit corresponds to a comparator of the monitor circuit and corresponds to one of the sensor inductors; wherein the sensor inductors of the master circuit are positioned remotely from the reference inductor in a plurality of aircraft systems; wherein the master circuit is configured to determine a change in inductance between each of the sensor inductors and the reference inductor when the metal is placed in proximity to the sensor inductors; and wherein the monitor circuit is configured to independently determine a change in inductance between each of the sensor inductors and the reference inductor when the metal is placed in proximity to the sensor inductors.

The method of any preceding clause, wherein each comparator of the master circuit receives a voltage across the reference inductor as a reference voltage and a voltage across one of the sensor inductors as an input voltage, such that each comparator of the master circuit outputs a low signal when the voltage across the reference inductor is greater than the voltage across one of the sensor inductors and outputs a high signal when the voltage across the reference inductor is lower than the voltage across one of the sensor inductors; and each comparator of the monitor circuit receives a voltage across the reference inductor as a reference voltage and a voltage across one of the sensor inductors as an input voltage, such that each comparator of the monitor circuit outputs a low signal when the voltage across the reference inductor is greater than the voltage across one of the sensor inductors and outputs a high signal when the voltage across the reference inductor is lower than the voltage across one of the sensor inductors.

The method of any preceding clause, further comprising determining the first outputs of each of the comparators of the master circuit; determining the second outputs of each of the comparators of the monitor circuit; when a comparator of the master circuit and the corresponding comparator of the monitor circuit both output a high signal, determining that a metal is in proximity to the corresponding sensor inductor; when a comparator of the master circuit and the corresponding comparator of the monitor circuit both output a low signal, determining that a metal is not in proximity to the corresponding sensor inductor; and when one of the comparator of the master circuit and the corresponding comparator of the monitor circuit outputs a high signal and the other of the comparator of the master circuit and the corresponding comparator of the monitor circuit outputs a low signal, determining that an error has occurred.

What is claimed is:

1. A proximity sensor comprising:
   a reference inductor;
   a first set of sensor inductors;
   a first set of comparators, each comparator of the first set of comparators corresponding to one of the sensor inductors of the first set of sensor inductors;
   a second set of comparators, each comparator of the second set of comparators corresponding to one of the sensor inductors of the first set of sensor inductors; and
   an alternating current voltage source to output a sinusoidal voltage to the reference inductor and each of the sensor inductors,
   wherein each comparator of the first set of comparators receives a voltage across the reference inductor as a reference voltage, such that each comparator of the first set of comparators receives the same reference voltage;
   wherein each comparator of the first set of comparators receives a voltage across a corresponding sensor inductor as an input voltage;
   wherein each comparator of the second set of comparators receives a voltage across the reference inductor as a reference voltage;
   wherein each comparator of the second set of comparators receives a voltage across a corresponding sensor inductor as an input voltage; and
   wherein each comparator of the second set of comparators is configured to output a high signal when the input voltage is higher than the reference voltage and each comparator of the second set of comparators is configured to output a low signal when the input voltage is lower than the reference voltage, thereby providing redundancy of detection to the first set of comparators.

2. The proximity sensor of claim 1, wherein each sensor inductor of the first set of sensor inductors is placed in a system of an aircraft to determine a status of the system.

3. The proximity sensor of claim 1, wherein the reference inductor is placed in a location remote from each of the sensor inductors of the first set of sensor inductors.

4. The proximity sensor of claim 1, wherein each comparator of the first set of comparators is configured to output a high signal when the input voltage is higher than the reference voltage and each comparator of the first set of comparators is configured to output a low signal when the input voltage is lower than the reference voltage.

5. The proximity sensor of claim 1, wherein the proximity sensor determines that a metal is in proximity to the proximity sensor based on output signals from the first set of comparators.

6. The proximity sensor of claim 1, further comprising:
a first capacitor in series with the reference inductor to create a first circuit branch; and
a set of capacitors, wherein each capacitor in the set of capacitors is in series with an inductor of the first set of sensor inductors to create a second circuit branch.

7. The proximity sensor of claim 1, wherein:
the reference inductor has a first inductance value;
each comparator of the first set of comparators is configured to output a low signal when the corresponding sensor inductor of the first set of sensor inductors has a second inductance value lower than the first inductance value; and
each comparator of the first set of comparators is configured to output a high signal when the corresponding sensor inductor of the first set of sensor inductors has a third inductance value greater than the first inductance value when a metal is in proximity to the corresponding sensor inductor.

8. The proximity sensor of claim 1, further comprising a second set of sensor inductors, wherein each sensor inductor of the second set of sensor inductors is positioned adjacent to one of the sensor inductors of the first set of sensor inductors to provide redundancy of detection.

9. The proximity sensor of claim 1, wherein the proximity sensor determines that a metal is in proximity to the proximity sensor based on output signals from the first set of comparators and output signals from the second set of comparators.

10. A proximity sensor comprising:
a master circuit; and
a monitor circuit positioned remotely from the master circuit,
wherein the master circuit comprises a reference inductor, a plurality of sensor inductors, and a plurality of comparators, each of the sensor inductors is positioned remotely from the reference inductor, and each comparator receives a voltage across the reference inductor as a reference voltage and a voltage across one of the sensor inductors as an input voltage, such that each comparator receives the same reference voltage and each comparator outputs a low signal when the voltage across the reference inductor is higher than the voltage across one of the sensor inductors and outputs a high signal when the voltage across the reference inductor is lower than the voltage across one of the sensor inductors;
wherein the master circuit is configured to determine a change in inductance between each of the sensor inductors and the reference inductor when a metal is placed in proximity to the sensor inductors;
wherein the monitor circuit comprises a plurality of second comparators;
wherein the monitor circuit is configured to independently determine a change in inductance between each of the sensor inductors and the reference inductor when a metal is placed in proximity to the sensor inductors; and
wherein each comparator of the plurality of second comparators receives a voltage across the reference inductor as a reference voltage and a voltage across one of the sensor inductors as an input voltage, such that each comparator of the plurality of second comparators outputs a low signal when the voltage across the reference inductor is greater than the voltage across one of the sensor inductors and outputs a high signal when the voltage across the reference inductor is lower than the voltage across one of the sensor inductors.

11. The proximity sensor of claim 10, further comprising an alternating current voltage source to output a sinusoidal voltage to the reference inductor and each of the sensor inductors.

12. The proximity sensor of claim 10, wherein the master circuit further comprises:
a first capacitor in series with the reference inductor to create a first circuit branch; and
a plurality of second capacitors, wherein each capacitor of the plurality of second capacitors is in series with one of the sensor inductors to create a plurality of second circuit branches.

13. The proximity sensor of claim 10, wherein:
the reference inductor has a first inductance value;
each sensor inductor has a second inductance value lower than the first inductance value when a metal is not in proximity to the sensor inductor; and
each sensor inductor has a third inductance value greater than the first inductance value when a metal is in proximity to the sensor inductor.

14. A method comprising:
applying an alternating current voltage to a reference inductor and a plurality of sensor inductors of a master circuit; and
determining whether a metal is in proximity to one or more of the plurality of sensor inductors based on first outputs of one or more comparators of the master circuit and second outputs of one or more comparators of a monitor circuit,
wherein each comparator of the master circuit corresponds to a comparator of the monitor circuit and corresponds to one of the plurality of sensor inductors;
wherein the plurality of sensor inductors of the master circuit are positioned remotely from the reference inductor in a plurality of aircraft systems;
wherein the master circuit is configured to determine a change in inductance between each of the plurality of sensor inductors and the reference inductor when the metal is placed in proximity to the plurality of sensor inductors;
wherein the monitor circuit is configured to independently determine a change in inductance between each of the plurality of sensor inductors and the reference inductor when the metal is placed in proximity to the plurality of sensor inductors;

wherein each comparator of the master circuit receives a voltage across the reference inductor as a reference voltage and a voltage across one of the plurality of sensor inductors as an input voltage, such that each comparator receives the same reference voltage and such that each comparator of the master circuit outputs a low signal when the voltage across the reference inductor is greater than the voltage across one of the plurality of sensor inductors and outputs a high signal when the voltage across the reference inductor is lower than the voltage across one of the plurality of sensor inductors; and wherein each comparator of the monitor circuit receives a voltage across the reference inductor as a reference voltage and a voltage across one of the plurality of sensor inductors as an input voltage, such that each comparator of the monitor circuit outputs a low signal when the voltage across the reference inductor is higher than the voltage across one of the plurality of sensor inductors and outputs a high signal when the voltage across the reference inductor is lower than the voltage.

15. The method of claim 14, further comprising:

determining the first outputs of each of the comparators of the master circuit;

determining the second outputs of each of the comparators of the monitor circuit;

when a comparator of the master circuit and the corresponding comparator of the monitor circuit both output a high signal, determining that a metal is in proximity to a corresponding sensor inductor of the plurality of sensor inductors;

when a comparator of the master circuit and the corresponding comparator of the monitor circuit both output a low signal, determining that a metal is not in proximity to the corresponding sensor inductor of the plurality of sensor inductors; and when one of the comparators of the master circuit and the corresponding comparator of the monitor circuit outputs a high signal and the other of the comparator of the master circuit and the corresponding comparator of the monitor circuit outputs a low signal, determining that an error has occurred.

\* \* \* \* \*